United States Patent [19]
Ettenberg et al.

[11] 3,767,481
[45] Oct. 23, 1973

[54] METHOD FOR EPITAXIALLY GROWING LAYERS OF A SEMICONDUCTOR MATERIAL FROM THE LIQUID PHASE

[75] Inventors: Michael Ettenberg, Freehold; Vincent Michael Cannuli, Trenton, both of N.J.

[73] Assignee: RCA Corporation, New York, N.Y.

[22] Filed: Apr. 7, 1972

[21] Appl. No.: 242,051

[52] U.S. Cl. .................. 148/171, 148/172, 118/415
[51] Int. Cl. .............................................. H01l 7/38
[58] Field of Search ........................... 148/171, 172; 23/301 SP; 118/415

[56] References Cited

UNITED STATES PATENTS

| | | | |
|---|---|---|---|
| 3,665,888 | 5/1972 | Bergh et al. | 148/171 X |
| 3,631,836 | 1/1972 | Jarvela et al. | 148/171 X |
| 3,690,965 | 9/1972 | Bergh et al. | 148/172 |

*Primary Examiner*—G. T. Ozaki
*Attorney*—Glenn H. Bruestle et al.

[57] ABSTRACT

A furnace boat having a plurality of spaced deposition solution containing wells in its upper surface with each well having a recess in its bottom surface. A slide extends through the boat so as to extend across each of the wells and over the recesses in the wells. The slide has a recess in its upper surface and an opening therethrough adjacent to but spaced from the recess. A plurality of epitaxial layers can be deposited on a substrate in succession by placing a separate source body of a semiconductor material in each well recess and a substrate in the slide recess. The deposition solutions are brought into contact with the respective source bodies through the opening in the slide to exactly saturate the deposition solutions with the semiconductor material and the substrate is then brought into contact with the exactly saturated solutions in succession to deposit the epitaxial layers.

1 Claim, 4 Drawing Figures

METHOD FOR EPITAXIALLY GROWING LAYERS OF A SEMICONDUCTOR MATERIAL FROM THE LIQUID PHASE

BACKGROUND OF THE INVENTION

The present invention relates to methods and apparatus for epitaxially growing one or more layers of a semiconductor material on a substrate by liquid phase epitaxy. More particularly, the present invention relates to such methods and apparatus wherein deposition solutions of the semiconductor material in a solvent are brought to saturation prior to bringing the substrate into the solutions.

A technique which has come into use for making certain types of semiconductor devices, particularly semiconductor devices made of the group III–V semiconductor materials and their alloys, such as light emitting devices and transferred electron devices, is known as "liquid phase epitaxy". Liquid phase epitaxy is a method for depositing an epitaxial layer of a single crystalline semiconductor material on a substrate wherein a surface of the substrate is brought into contact with a solution of a semiconductive material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxial layers can be deposited one on top of the other to form a semiconductor device of a desired construction including a semiconductor device having a PN junction between adjacent epitaxial layers of opposite conductivity type.

U.S. Pat. No. 3,565,702 to H. Nelson issued Feb. 23, 1971 entitled "Depositing Successive Epitaxial Semiconductive Layers From The Liquid Phase" describes a method and apparatus for depositing one or more epitaxial layers by liquid phase epitaxy which are particularly useful for depositing a plurality of epitaxial layers in succession. The apparatus includes a furnace boat of a refractory material having a plurality of spaced wells in its top surface and a slide of a refractory material movable in a passage which extends across the bottoms of the wells. In the use of this apparatus, a solution is provided in a well and a substrate is placed in a recess in the slide. The slide is then moved to bring the substrate into the bottom of the well so that the surface of the substrate is brought into contact with the solution. When the epitaxial layer is deposited on the substrate, the slide is moved to carry the substrate out of the well. To deposit a plurality of epitaxial layers on the substrate, separate solutions are provided in separate wells and the substrate is carried by the slide to each of the wells in succession to deposit the epitaxial layers on the substrate.

In the use of liquid phase epitaxy, it is desirable that the deposition solution be exactly saturated with the semiconductor material at the temperature that the deposition takes place. If the solution is oversaturated with the semiconductor material, the solution will contain solid particles of the semiconductor material which often results in poor crystalline quality of the deposited epitaxial layer. If the solution is unsaturated with the semiconductor material the substrate when introduced into solution will dissolved in the solution in an uncontrollable way. This will result in poor planarity of the deposited layer. To achieve exact saturation of the solution at the deposition temperature by controlling the proportions of the ingredients originally used to form the solution is difficult since slight variations in the temperature will change the solubility of the solution. This becomes even more difficult when depositing a plurality of epitaxial layers in succession from a plurality of solutions as described in U.S. Pat. No. 3,565,702 since each layer is deposited at a different temperature.

Various techniques have been developed for saturating the deposition solution at the temperature at which the deposition is to start using an apparatus similar to that shown in U.S. Pat. No. 3,565,702. Although each of these techniques satisfactorily achieves the saturated deposition solution, each has certain disadvantages under certain conditions. One such technique is to provide a second recess in the slide ahead of and spaced from the substrate receiving recess. A source body of the semiconductor material is placed in the second recess. The slide is moved to bring the source body into contact with each deposition solution prior to bringing the substrate into contact with the solution. Thus, each solution is saturated with the semiconductor material from the source body just prior to bringing the substrate into the solution. However, when depositing a plurality of layers in succession with this technique, each layer must be of the same semiconductor material. Also, when the source body is moved from one solution to the next it carries with it a thin layer of the preceding solution. If the solutions contain different ingredients, such as different conductivity modifiers, the layer of the preceding solution carried on the source body can contaminate the next solution and adversely affect the layer deposited from the next solution.

Another technique which has been developed for saturating the solutions which overcomes the problem of the technique described above is to provide a separate source body of the semiconductor material seated on each of the deposition solutions. Thus each source body can be of the same semiconductor material as that in the solution so that each solution can contain a different semiconductor material. Also, there is no contamination of the solutions since the source body is not moved from solution to solution. However, this technique can have problems particularly when the semiconductor material in the solution is of a different composition from that of the substrate on which the epitaxial layer is to be deposited. When the solution is cooled to deposit some of the semiconductor material from the solution onto the substrate, some of the semiconductor material in the solution will also deposit back onto the source body. If the substrate is of a different composition from the semiconductor material in the solution, there may be a greater tendency for the semiconductor material in the solution to deposit back on the source body, which is of the same composition as the semiconductor material in the solution, then onto the substrate. Thus, the epitaxial layer deposited on the substrate may not be of the desired quality or thickness.

SUMMARY OF THE INVENTION

An epitaxial layer of a single crystalline semiconductor material is deposited on the substrate using a furnace boat having a well in a surface thereof, a recess in the bottom of the well, and a slide extending across the well and over the well recess with the slide having a recess in a surface thereof and an opening therethrough. A solvent for the semiconductor material is provided in the well. A substrate is provided in one of the recesses and a source body of the semiconductor material is provided in the other recess. The solvent is heated to a temperature at which a desired amount of the semiconductor material will dissolve in the solvent. The slide is moved to bring the source body into contact with the solvent so that enough of the semiconductor material of the source body will dissolve in the solvent to saturate the solvent with the semiconductor material. The slide is moved to bring the substrate into contact with the saturated solvent and the saturated solvent is cooled to deposit on the epitaxial layer of the semiconductor material on the substrate.

DETAILED DESCRIPTION

Figure 1:
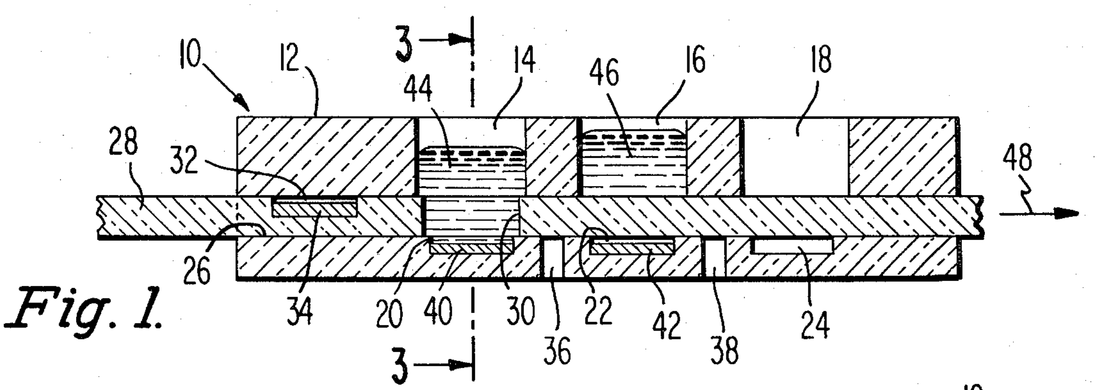
FIG. 1 is a sectional view of a form of the apparatus of the present invention as used in one embodiment of the method of the present invention.
Figure 2:
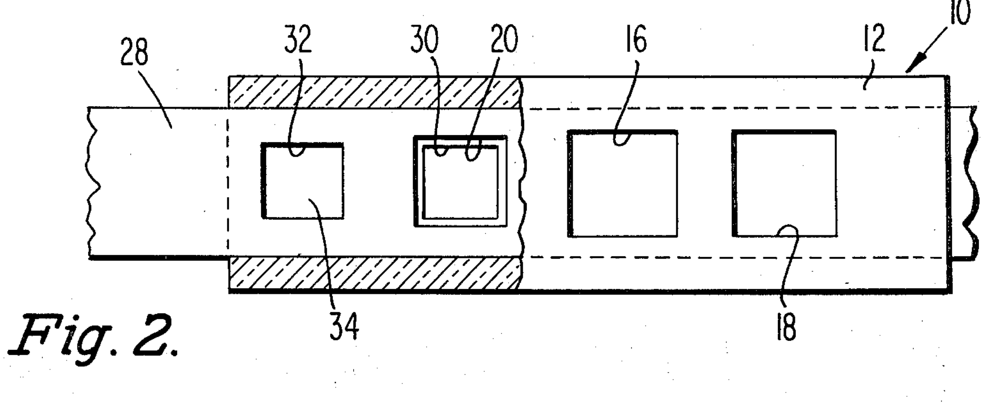
FIG. 2 is a top plan view partially broken away of the apparatus of FIG. 1.
Figure 3:
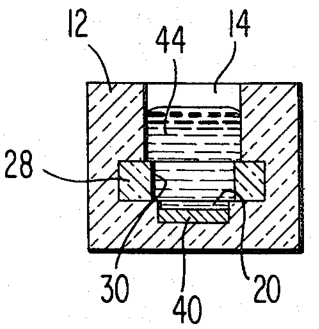
FIG. 3 is a sectional view taken along line 3—3 of FIG. 1.

Referring to the drawing, a form of the apparatus of the present invention is generally designated as 10. The apparatus 10 comprises a furnace boat 12 of an inert, refractory material, such as graphite. The boat 12 has three spaced solution container wells 14, 16 and 18 in its upper surface. Each of the wells 14, 16 and 18 has a recess 20, 22 and 24, respectively, in its bottom surface. A passage 26 extends longitudinally through the boat 12 from one end to the other end and extends across the bottoms of the wells 14, 16 and 18 and over the recesses 20, 22 and 24. A slide 28 of a refractory material, such as graphite, movably extends through the passage 26. The slide 28 extends across the wells 14, 16 and 18 and over the recesses 20, 22 and 24. The slide 28 has an opening 30 therethrough from its top surface to its bottom surface, and a substrate receiving recess 32 in its top surface adjacent to the opening 30. The substrate receiving recess 32 is spaced from the opening 30 a distance substantially equal to the spacing between adjacent wells of the boat 12, and is large enough to receive a flat substrate 34 therein with the substrate lying flat in the recess. Preferably, the substrate receiving recess 32 is slightly deeper than the thickness of the substrate 34 so that the upper surface of the substrate is below the top of the recess. The boat 12 has vent holes 36 and 38 therethrough from the bottom surface of the boat to the passage 26. The vent holes 36 and 38 are positioned at substantially the center line of the passage 26 with the vent hole 36 being between the wells 14 and 16 and the vent hole 38 being between the wells 16 and 18.

To carry out one embodiment of the method of the present invention to deposit a plurality of epitaxial layers on a substrate in succession with the apparatus 10, the slide 28 is removed from the boat 12 and separate source bodies 40 and 42 are placed in the well recesses 20 and 22, respectively. The source bodies 40 and 42 are each of the semiconductor material which is to be deposited in the respective wells. A substrate 34 of a material suitable for epitaxial deposition is placed in the substrate receiving recess 32 in the slide 28 and the slide 28 is placed back in the passage 26. The slide 28 is positioned in the passage 26 with the opening 30 either within the well 14 or just outside of the well 14, i.e., to the left of the well 14 as viewed in FIG. 1.

A first charge is placed in the well 14 and a second charge is placed in the well 16. Each of the charges is a metal solvent for the semiconductor material to be deposited in the respective well. For example, if the semiconductor material to be deposited is gallium arsenide or an alloy thereof, the metal solvent can be gallium. Each of the charges can also include a small amount of the semiconductor material to be deposited, which is the same semiconductor material of the respective source body, and a conductivity modifier if the epitaxial layer to be deposited is to be of a particular conductivity type. The loaded furnace boat 12 is then placed in a furnace tube (not shown) and a flow of high purity hydrogen is provided through the furnace tube and over the furnace boat 12. The heating means for the furnace tube is turned on to heat the contents of the furnace boat to a temperature at which the metal solvent is molten and at which a desired amount of the semiconductor material will dissolve in the molten solvent, for example between 800° and 950°C for GaAlAs or GaAs.

As the charges are heated to the desired temperature, any semiconductor material and the conductivity modifier in the charges will dissolve in the molten metal solvent. Thus, the first charge becomes a first solution 44 of the semiconductor material and the conductivity modifier in the molten metal solvent, and the second charge becomes a second solution 46 of the semiconductor material and the conductivity modifier in the molten metal solvent. If the initial charges include some of the semiconductor material, the amount included should not be enough to saturate the molten metal solvent. If the slide 28 is initially positioned with the opening 30 being within the well 14, the first solution 44 will drop through the opening 30 and contact the source body 40. Thus, as the first solution 44 is heated, some of the semiconductor material of the source body 40 will also dissolve in the molten metal solvent until the solvent is exactly saturated with the semiconductor material at the temperature to which the first solution 44 is initially heated. If the slide 28 is initially positioned with the opening 30 outside the well 14, when the desired initial temperature is reached the slide 28 is moved in the direction of the arrow 48 in FIG. 1 until the opening 30 is within the well 14. The first solution 44 will then drop through the opening 30 and contact the source body 40. Some of the semiconductor material of the source body 40 will then dissolve in the molten metal solvent of the first solution 44 until the molten metal solvent is exactly saturated with the semiconductor material.

When the first solution 44 has been maintained in contact with the source body 40 long enough to ensure the achievement of an exactly saturated first solution, the slide 28 is then moved in the direction of the arrow 48 to move the opening 30 from the well 14 to the well 16. As the slide 28 is so moved, some of the first solution 44 may become entrapped within the opening 30 and be carried with the slide. However, as the opening 30 passes over the vent hole 36 any of the entrapped first solution in the opening 30 can drain out through the vent hole 36 so that the opening 30 will be empty when it reaches the well 16. When the opening 30 comes within the well 16 the second solution 46 will drop down through the opening 30 onto the source body 42. Some of the semiconductor material of the source body 42 will then dissolve in the heated second solution 46, enough time being allowed so that the molten metal solvent of the second solution is also exactly saturated with the semiconductor material.

Since the substrate receiving recess 32 is spaced from the opening 30 a distance equal to the spacing between adjacent wells, when the opening 30 is moved from the well 14 to the well 16, the substrate 34 is simultaneously moved into the well 14. This brings the substrate 34 into contact with the first solution 44 which is now exactly saturated with the semiconductor material. The temperature of the furnace tube is then lowered to a first preselected temperature. Cooling of the exactly saturated first solution 44 causes some of the semiconductor material in the solution to precipitate out of the solution and deposit on the surface of the substrate 34 to form a first epitaxial layer. Some of the conductivity modifier in the first solution becomes incorporated in the lattice of the first epitaxial layer to provide the first epitaxial layer with a desired conductivity type.

When the substrate 34 is moved into the well 14, the slide 28 comes between the first solution 44 and the source body 40 so that the first solution is no longer in contact with the source body 40. Thus, the source body 40 cannot interfere with the deposition of the first epitaxial layer so that the deposition takes place entirely on the substrate 34 even if the substrate is of a composition different from that of the semiconductor material.

Cooling of the first solution 44 to deposit the epitaxial layer on the substrate 34 also cools the second solution 46. Since the second solution 46 is also saturated with the semiconductor material, the cooling of the second solution will cause some of the semiconductor material in the second solution to precipitate and deposit back on the source body 42. This maintains the second solution 46 exactly saturated with the semiconductor material even though the temperature of the solution has been lowered. The slide 28 is now again moved in the direction of the arrow 48 to move the substrate 34 with the first epitaxial layer thereon from the well 14 to the well 16. This brings the surface of the first epitaxial layer into contact with the second solution 46 which is exactly saturated with the semiconductor material at the then temperature of the solution. The temperature of the furnace tube is then lowered again to a second preselected temperature lower than the first preselected temperature. Cooling of the exactly saturated second solution 46 causes some of the semiconductor material in the second solution to precipitate and deposit on the surface of the first epitaxial layer to form a second epitaxial layer of the semiconductor material. Some of the conductivity modifier in the second solution 46 becomes incorporated in the lattice of the second epitaxial layer to provide the second epitaxial layer with a desired conductivity type.

When the substrate 34 is moved into the well 16, the slide 28 comes between the second solution 46 and the source body 42 so that the second solution is no longer in contact with the source body 42. Thus, the source body 42 cannot interfere with the deposition of the second epitaxial layer. Also, the movement of the slide 48 to move the substrate 34 into the well 16 moves the opening 30 from the well 16 to the well 18. As the opening 30 passes over the vent hold 38 any of the second solution entrapped in the opening 30 can flow out of the opening through the vent hole 38. After the second epitaxial layer is deposited on the first epitaxial layer, the slide 28 is again moved in the direction of the arrow 48 to move the substrate 34 with the two epitaxial layers thereon from the well 16 to the well 18 where the substrate can be removed from the slide.

Although this one embodiment of the method of the present invention has been described with regard to depositing two successive epitaxial layers, it can be used to deposit either a single epitaxial layer or more than two epitaxial layers. To deposit a single epitaxial layer only one solution is used. To deposit more than two epitaxial layers on the substrate, the furnace boat 12 is provided with additional wells so that there is a separate well for each solution from which an epitaxial layer is to be deposited. As the slide 28 is moved to carry the substrate 34 from one well to the next so as to successively deposit the epitaxial layers on the substrate, the opening 30 precedes the substrate so that each solution contacts its respective source body to bring the solution to exact saturation and maintain such exact saturation until the substrate is brought into the solution.

Thus, in this embodiment of the method of the present invention, each solution is brought into contact with a separate source body of the semiconductor material so as to exactly saturate the solution with the semiconductor material and maintain such exact saturation until the substrate is brought into the solution even if the temperature of the solution changes. This provides for the deposition of the epitaxial layers from an exactly saturated solution so as to deposit epitaxial layers of good crystalline quality and good planarity. However, when the substrate is brought into each solution, the solution is separated from its respective source body so that the source body does not interfere with the deposition of the epitaxial layers. Also, since each solution has its own separate source body, the solutions can contain semiconductor materials of different compositions so as to permit the deposition of epitaxial layers of different compositions of the semiconductor material.

Figure 4:
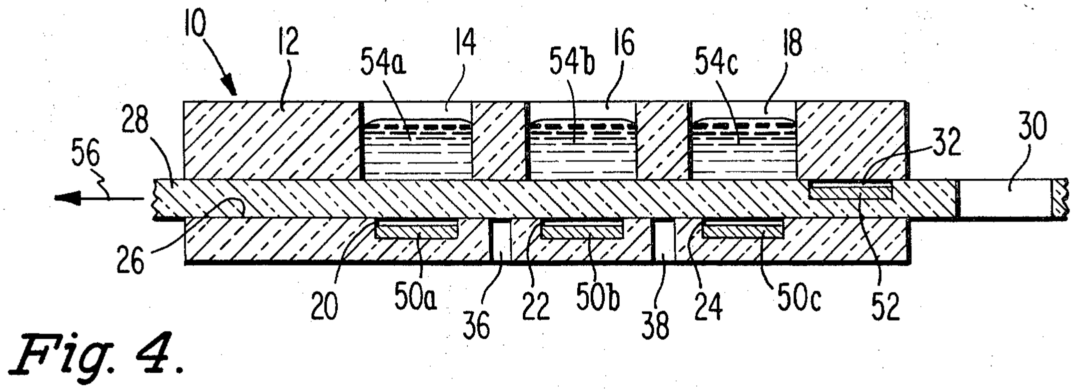
FIG. 4 is a sectional view of the form of the apparatus shown in FIG. 1 as used in another embodiment of the method of the present invention.

Referring to FIG. 4 there is shown the apparatus 10 as used for another embodiment of the method of the present invention wherein an epitaxial layer of a semiconductor material is deposited on each of a plurality of substrates. To carry out this method, the slide 28 is removed from the boat 12 and individual substrates 50*a*, 50*b* and 50*c* are placed in each of the well recesses 20, 22 and 24 respectively. A source body 52 is placed in the slide recess 32 and the slide 28 is placed back in the passage 26. The slide 28 is positioned with the recess 32 being at the end of the boat 12 to the right of the well 18 as viewed in FIG. 4 and with the slide extending through each of the wells 14, 16 and 18 and over the substrates 50*a*, 50*b* and 50*c* as shown in FIG. 4.

Separate charges are placed in each of the wells 14, 16 and 18. Each of the charges is a metal solvent for the semiconductor material to be deposited and may also include a small amount of the semiconductor material and a conductivity modifier. In this method the semiconductor material included in each of the charges must be of the same composition. The loaded furnace boat 12 is placed in a furnace tube (not shown) and a flow of high purity hydrogen is provided through the furnace tube and over the furnace boat 12. The heating means for the furnace tube is turned on to heat the contents of the furnace boat to a temperature at which the metal solvent is molten and at which a desired amount of the semiconductor material will dissolve in the metal solvent. As the charges are heated any semiconductor material and conductivity modifier in the charges dissolve in the molten metal solvent. Thus, the charges in the wells 14, 16 and 18 become solutions 54*a*, 54*b* and 54*c*, respectively, of the semiconductor material and the conductivity modifier in the moltent metal solvent.

The slide 28 is then moved in the direction of the arrow 56 in FIG. 4 until the source body 52 is within the well 18. This brings the source body 52 into contact with the solution 54*c* so that some of the semiconductor material of the source body 52 will dissolve in the molten metal solvent of the solution 54*c* until the metal solvent is exactly saturated with the semiconductor material. The slide 28 is then again moved in the direction of the arrow 56 until the source body 52 is within the well 16. This brings the source body 52 into contact with the solution 54*b* so that some of the semiconductor material of the source body 52 will dissolve in the molten metal solvent of the solution 54*b* until the metal solvent is exactly saturated with the semiconductor material.

When the source body 52 is moved from the well 18 to the well 16, the opening 30 in the slide 28 is moved into the well 18. This allows the exactly saturated solution 54*c* in the well 18 to drop down through the opening 30 onto the substrate 50*c* in the well recess 24. The temperature of the furnace tube is then reduced to cool the furnace boat and its contents to a first preselected temperature. Cooling of the exactly saturated solution 54c causes some of the semiconductor material in the solution 54*c* to precipitate out and deposit on the surface of the wafer 50*c* to form an epitaxial layer. During the deposition of the semiconductor material some of the conductivity modifier in the solution 54*c* becomes incorporated in the epitaxial layer to provide the epitaxial layer with a desired conductivity type.

Cooling of the solution 54*c* to deposit an epitaxial layer on the substrate 50*c* also cools the solution 54*b* in the well 16. Since the solution 54*b* is also exactly saturated with the semiconductor material, the cooling of the solution 54*b* will cause some of the semiconductor material in the solution 54*b* to precipitate and deposit back on the source body 52. This maintains the solution 54*b* exactly saturated with the semiconductor material at the then temperature of the solution. The slide 28 is then again moved in the direction of the arrow 56 to move the source body 52 into the well 14. This brings the source body 52 into contact with the solution 54*a* in the well 14 and some of the semiconductor material of the source body 52 will dissolve in the molten metal solvent of the solution 54*a* until the solvent is exactly saturated with the semiconductor material.

When the source body 52 is moved from the well 16 to the well 14, the opening 30 in the slide 28 is moved from the well 18 into the well 16. As the opening 30 passes over the vent hole 38, any of the solution 54*c* entrapped in the opening 30 can flow from the opening 30 through the vent hole 38 so that the opening 30 is empty when it reaches the well 16. When the opening 30 comes into the well 16, the solution 54*b* in the well 16 drops down through the opening 30 onto the substrate 50*b* in the well recess 22. The temperature of the furnace tube is then lowered to cool the furnace boat 12 and its contents to a second preselected temperature lower than the first preselected temperature. This cools the solution 54*b* so that some of the semiconductor material in the exactly saturated solution 54*b* precipitates and deposits on the surface of the substrate 50*b* to form an epitaxial layer on the substrate. Some of the conductivity modifier in the solution 54*b* becomes incorporated in the lattice of the deposited epitaxial layer to provide an epitaxial layer of a desired conductivity type.

The cooling of the solution 54*b* to deposit the epitaxial layer on the substrate 50*b* also cools the solution 54*a* in the well 14. The cooling of the exactly saturated solution 54*a* causes some of the semiconductor material in the solution 54*a* to precipitate and deposit back on the source 52. This maintains the solution 54*a* exactly saturated with the semiconductor material at the then temperature of the solution. The slide 28 is then again moved in the directon of the arrow 56 to move the opening 30 into the well 14. As the opening 30 moves from the well 16 to the well 14 it passes over the vent hole 36. This permits any of the solution 54*b* entrapped in the opening 30 to flow out of the opening 30 through the vent hole 36 so that the opening 30 is empty when it reaches the well 14. When the opening 30 is within the well 14, the solution 54*a* in the well 14 drops through the opening 30 onto the substrate 50*a* in the well recess 20. The temperature of the furnace tube is further lowered to cool the furnace boat 12 and its contents to a third preselected temperature lower than the second preselected temperature. This cooling of the exactly saturated solution 54*a* causes some of the semiconductor material in the solution to precipitate and deposit on the substrate 50*a* to form an epitaxial layer. Also, some of the conductivity modifier in the solution becomes incorporated in the lattice of the epitaxial layer so as to provide an epitaxial layer of a desired conductivity type.

The slide 28 is then again moved in the direction of the arrow 56 to move the opening 30 out of the well 14. The furnace boat 12 can then be removed from the furnace tube and the solutions 54*a*, 54*b* and 54*c* removed from the wells 14, 16 and 18 so that the substrate 50*a*, 50*b* and 50*c* with the epitaxial layers thereon can be removed from the furnace boat 12.

Thus, this embodiment of the method of the present invention provides for depositing an epitaxial layer on each of a plurality of substrates in succession. Although this embodiment of the method of the present invention has been described with regard to depositing an epitaxial layer on each of three substrates in succession, any number of substrates can be so coated by providing a furnace boat having a separate well for each substrate. In the deposition of an epitaxial layer by liquid phase epitaxy the thickness of the deposited layer is dependent on the temperature drop during the deposition step. Thus, the substrates can be coated with epitaxial layers of uniform thickness or of different thicknesses as desired. In this embodiment, like in the first described embodiment, each of the deposition solutions is brought to exact saturation at the temperature at which the deposition is to start and before the substrate is brought into contact with the solution so that the deposition of the epitaxial layer is from an exactly saturated solution. Also, when the substrate is brought into contact with the exactly saturated solution, the source body used to saturate the solution is out of contact with the solution so that the source body does not interfere with the deposition of the epitaxial layer on the substrate.

We claim:

1. A method of depositing on a substrate a plurality of epitaxial layers of single crystalline semiconductor material in succession comprising the steps of providing in each of a plurality of spaced wells in a furnace boat a solvent for the semiconductor material of each of the layers, placing in the bottom of each of the plurality of wells a source body of the particular semiconductor material to be deposited for each of the layers, placing a slide across said wells to separate the source bodies from the solvents, heating said solvents, removing said slide from across each of said wells in succession to bring the solvent in each well into contact with the respective source body and permit enough of the semiconductor material of the body to dissolve in the solvent to saturate the solvent with the semiconductor material, replacing the slide across each of said wells in succession to separate each body from its respective conductor material containing solvent, bringing the substrate into each of the semiconductor material containing solvents in succession, and while the substrate is in each semiconductor material containing solvent, cooling the solvent to deposit an epitaxial layer of the semiconductor material on the substrate.

* * * * *